(12) United States Patent
Suzuki et al.

(10) Patent No.: US 6,456,505 B1
(45) Date of Patent: Sep. 24, 2002

(54) ELECTRONIC DEVICE AND ATTACHMENT STRUCTURE THEREOF

(75) Inventors: Norio Suzuki, Fukushima-ken (JP); Hideharu Otake, Cupertino, CA (US)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/909,450

(22) Filed: Jul. 19, 2001

(51) Int. Cl.⁷ .............................. H05K 1/11; H05K 1/14
(52) U.S. Cl. .................. 361/803; 361/802; 361/807; 361/760–761; 361/784; 361/749; 361/750–751; 174/35 R
(58) Field of Search .................. 361/803, 752, 361/816, 818, 800, 801, 802, 760–761, 784–791, 749, 750, 751; 174/35 R

(56) References Cited

U.S. PATENT DOCUMENTS 5,375,040 A * 12/1994 Cooper et al. .............. 361/730
6,320,762 B1 * 11/2001 Chen et al. ................. 361/818

FOREIGN PATENT DOCUMENTS

| JP | 10-259732 | 9/1998 |
| JP | 00-040864 | 2/2000 |

* cited by examiner

Primary Examiner—David Martin
Assistant Examiner—Thanh Yen Tran
(74) Attorney, Agent, or Firm—Brinks Hofer Gilson & Lione

(57) ABSTRACT

An electronic device having a plurality of leader patterns, and penetration portions penetrating the leader patterns, provided in an extension portion of a printed board projecting from a housing. The respective leader patterns are configured to function as connection terminals by connecting directly to lands on a mother board without the use of separate metal terminals.

3 Claims, 5 Drawing Sheets

016
ELECTRONIC DEVICE AND ATTACHMENT STRUCTURE THEREOF

BACKGROUND OF THE INVENTION (a) Field of the Invention

The present invention relates to an electronic device in which an extension portion projects from a printed board disposed in a housing, and a plurality of leader patterns are provided on the extension portion, and in particular, relates to an attachment structure for a mounting the electronic device on to a mother board.

(b) Description of Background Art

In an electronic device such as a tuner or the like, it is necessary to enclose a printed board in a box-like housing so as to shield the circuit parts mounted on the printed board from unnecessary external signals, or so as to shield circuits near the electronic device from signals, noise, or the like generated by the circuit parts of the electronic device.

FIG. 10 is a front view showing an example of a conventional electronic device in the background art. The electronic device shown in FIG. 10 is commonly referred to as a vertical type electronic device. The electronic device is, for example, a tuner, and is constituted by a box-like housing 10 and a printed board 11 received in the housing 10. An extension portion 12 projecting downward from the housing 10 is provided on the printed board 11 so as to extend therefrom. A plurality of leader patterns 13 are provided in parallel on the extension portion 12, while metal terminals 14 for input/output are fixed to the leader patterns 13 by caulking, respectively. In addition, a plurality of leg pieces 15 extending downward are provided on the housing 10 so as to project therefrom. The leg pieces 15 are located on opposite sides of the extension portion 12.

FIG. 11 is a front view showing another example of a conventional electronic device in the background art. This electronic device is commonly referred to as a horizontal type electronic device, and has a basic structure that is similar to that of the vertical type shown in FIG. 10. However, in this horizontal type electronic device, an extension portion 22 projects laterally from a housing 20, while metal terminals 24, fixed to respective leader patterns 23 by caulking, are bent downward at right angles.

The vertical type and horizontal type electronic device configured as described above are often mounted on a set-side mother board 16. In particular, the respective metal terminals 14 and 24 and the respective leg pieces 15 and 25 are each inserted into insertion holes formed in the mother board 16. Where the housing 10 is retained on the mother board 16 by the respective leg pieces 15 and 25, lands formed on the back surface of the mother board 16 and the respective metal terminals 14 and 24 are soldered by applying jet solder (flow-dip solder).

However, in the aforementioned conventional electronic devices, the metal terminals 14, 24 are fixed by caulking respectively to the plurality of leader patterns 13, 23 provided in parallel on the extension portion 12, 22. Accordingly, there is a problem in that the cost of the individual parts, or the cost of assembling these parts, increases the cost of manufacturing these electronic devices. In addition, there is a problem that the metal terminals 14, 24 are apt to be deformed when they are mounted onto the mother board 16, or are deformed in transit before they are mounted on to the mother board 16.

Moreover, in the case of the horizontal type electronic device shown in FIG. 11, the total length of each of the metal terminals 24 is longer than that in the case of the vertical type electronic device shown in FIG. 10. Therefore, the likelihood that the metal terminals 24 of the horizontal type electronic device will become deformed is significantly increased. In addition, the step of bending the metal terminals 24 at right angles by use of a jig is required after the metal terminals 24 are fixed to the leader patterns 23. It is therefore necessary to strictly control the bending accuracy of the metal terminals 24. This bending operation likewise increases the cost of manufacturing these devices.

It is an object of the present invention to provide an electronic device in which conventional type metal terminals are omitted so that the manufacturing cost can be reduced. It is another object of the present invention to provide an attachment structure which permits an electronic device to be mounted on a mother board easily and surely.

SUMMARY OF THE INVENTION

According to a first aspect of the present invention, an electronic device comprises a plurality of leader patterns and penetration portions penetrating the leader patterns are provided on an extension portion of a printed board projecting from a housing. When such an electronic device is to be mounted on a mother board, the extension portion is inserted into an insertion hole in the mother board so as to project out from the back surface of the mother board. The respective leader patterns of the extension portion and respective lands of the mother board are then soldered to each other by the application of jet solder. The jet solder is applied to the extension portion so as pass through the penetration portions. Thus, the amount of jet solder that remains between adjacent leader patterns is greatly reduced so that generation of solder bridges can be avoided. This aspect of the present invention is particularly suited to a vertical type electronic device.

According to another aspect of the present invention, a plurality of metal terminals are provided erectly on the surface of the mother board. The metal terminals of the mother board are then inserted into the respective penetration portions of the extension portion of the electronic device, and the respective leader patterns of the extension portion and the respective metal -terminals of the mother board are soldered to each other. This aspect of the present invention is particularly suited to a horizontal type electronic device.

DESCRIPTION OF THE PREFERRED EMBODIMENTS

Figure 1:
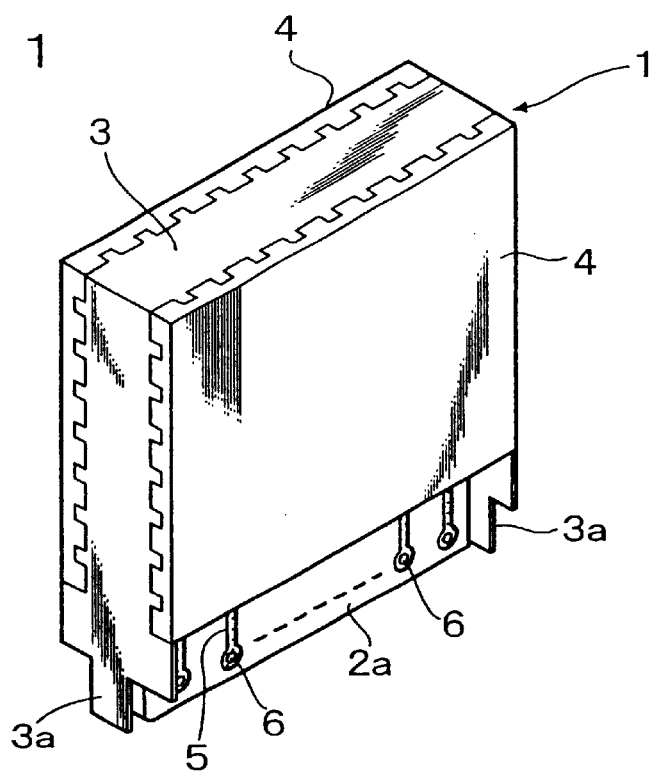
FIG. 1 is a perspective view showing a vertical type electronic device according to a first embodiment of the present invention.
Figure 2:
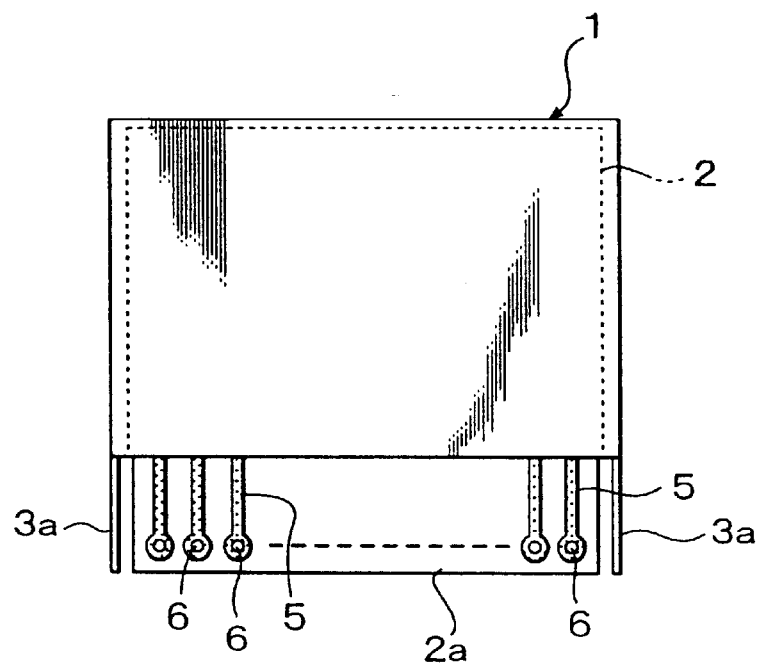
FIG. 2 is a front view of the vertical type electronic device.
Figure 3:
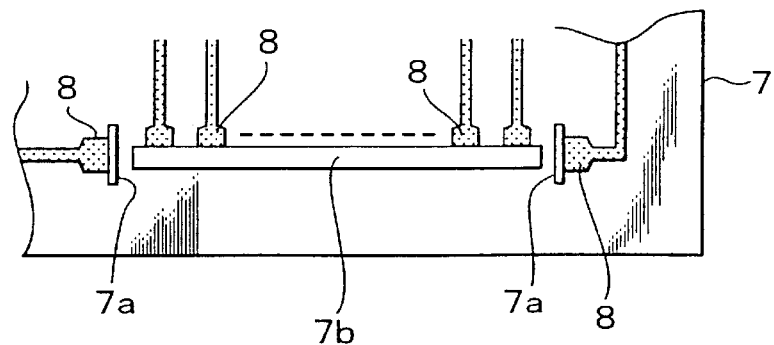
FIG. 3 is a plan view showing a portion of a mother board on which the vertical type electronic device is mounted, when viewed from the back surface of the mother board.
Figure 4:
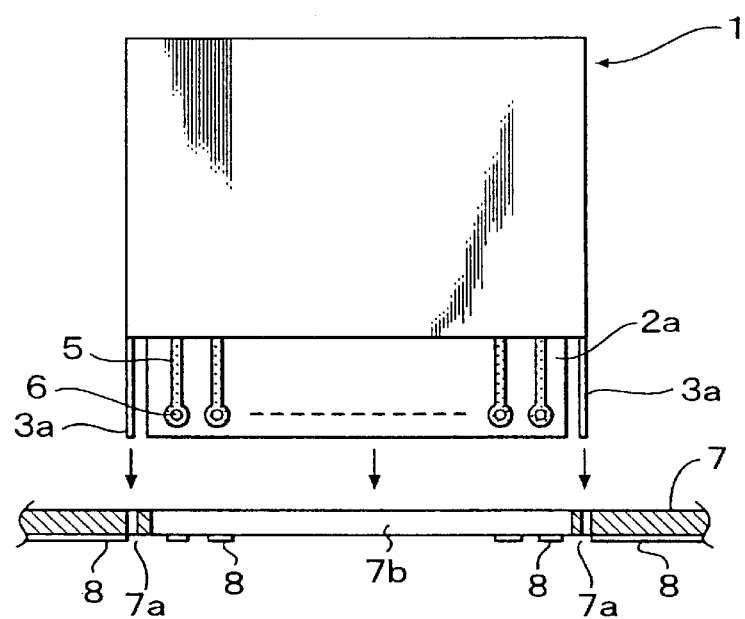
FIG. 4 is a front view showing a stage of assembly immediately before the vertical type electronic device is mounted on the mother board.
Figure 5:
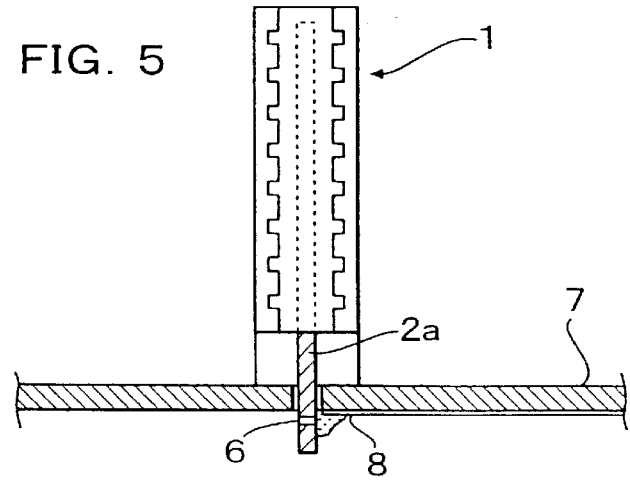
FIG. 5 is a partial sectional view of the vertical type electronic device mounted on the mother board, when viewed from a side of the electronic device.

An example of an electronic device called a vertical type will first be described with reference to FIGS. 1 to 5. FIG. 1 is a perspective view of an electronic device according to a first embodiment of the present invention; FIG. 2 is a front view of the electronic device; FIG. 3 is a plan view showing a portion of a mother board on which the electronic device is mounted, when viewed from the back surface of the mother board; FIG. 4 is a front view showing a stage of assembly immediately before the electronic device is mounted on the mother board; and FIG. 5 is a partial sectional view of the electronic device mounted on the mother board, when viewed from a side of the electronic device.

The electronic device shown in FIGS. 1 and 2 is, for example, a tuner. This electronic device is comprised of a box-like housing 1, and a printed board 2 received in the housing 1. The housing 1 is constituted by a frame body 3 opened across its front and back faces, and a pair of covers 4 for covering the two opened faces of the frame body 3, respectively. The frame body 3 and the covers 4 are each formed of metal plates. Leg pieces 3a are formed on the opposite side surfaces of the frame body 3. The leg pieces 3a project downward.

Circuit parts (not shown) are mounted on the printed board 2. The printed board 2 includes an extension portion 2a that penetrates the bottom of the frame body 3 so as to project downward therefrom. A plurality of leader patterns 5 are provided in parallel on the extension portion 2a. In the head portion of each of the leader patterns 5, a through hole 6 is provided as a penetration portion.

The two leg pieces 3a of the frame body 3 are located on the opposite sides of the extension portion 2a. The length of projection of the leg pieces 3a and the extension portion 2a are set to be substantially equal to each other.

As shown in FIG. 3, insertion holes 7a corresponding to the two leg pieces 3a and an insertion hole 7b corresponding to the extension portion 2a are provided in a set-side mother board 7 on which the electronic device shown in FIGS. 1 and 2 is mounted. In addition, a plurality of lands 8 to be soldered with the two leg pieces 3a and the respective leader patterns 5 are provided on the back surface of the mother board 7. The lands 8 are located adjacent to the respective insertion holes 7a and 7b.

As shown in FIG. 4, when the aforementioned vertical type electronic device is mounted on the mother board 7, the two leg pieces 3a and the extension portion 2a of the electronic device are first inserted into the insertion holes 7a and 7b, respectively, from above the mother board 7, so that the housing 1 is secured to the mother board 7 by the two leg pieces 3a. At this time, the lower half of the extension portion 2a projects from the back surface of the mother board 7 through the insertion hole 7b. The head portions of the respective leader patterns 5 and the through holes 6 are disposed slightly beneath the back surface of the mother board 7 (i.e., slightly within the insertion hole 7b). As shown in FIG. 5, jet solder (flow-dip solder) is then applied from the back surface side of the mother board 7 so that the two leg pieces 3a and the respective leader patterns 5 of the electronic device are soldered with the respective lands 8. The vertical type electronic device is thus mounted on the mother board 7.

In the vertical type electronic device according to the first embodiment, the plurality of leader patterns 5, and the through holes 6 penetrating the respective leader patterns 5, are provided in the extension portion 2a of the printed board 2 projecting downward from the frame body 3 of the housing 1. The leader patterns 5 are soldered with the respective lands 8 of the mother board 7. Accordingly, the respective leader patterns 5 provided in the printed board 2 function as connection terminals. Thus, metal terminals (as used in the conventional device) are omitted, and the manufacturing cost of the electronic device is reduced. In addition, because the metal terminals have been omitted, the deformation of these metal terminals resulting from transport or mounting procedures is prevented. Moreover, when such a vertical type electronic device is mounted on the mother board 7, the respective leader patterns 5 provided in the extension portion 2a can be soldered with the respective lands 8 of the mother board 7 by merely inserting the extension portion 2a of the electronic device into the insertion hole 7b of the mother board 7. In addition, jet solder applied to the extension portion 2a passes through the through holes 6 during the soldering procedure. Thus, the amount of jet solder remaining between adjacent leader patterns 5 is minimized so that generation of solder bridges is prevented.

Figure 6:
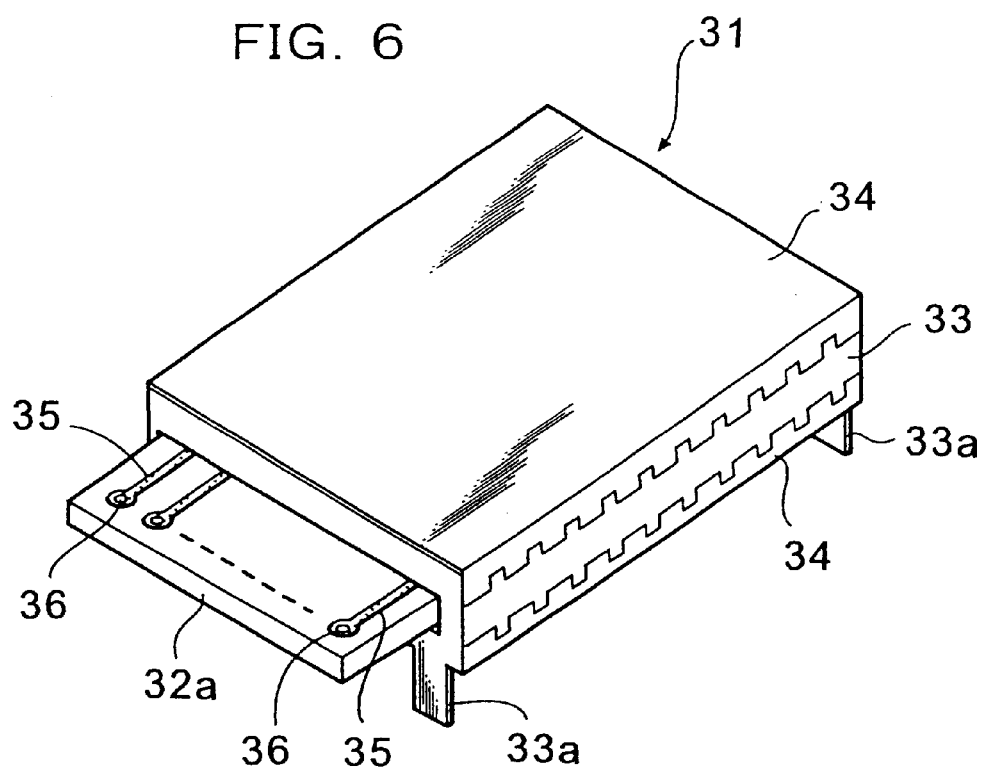
FIG. 6 is a perspective view showing a horizontal type electronic device according to a second embodiment of the present invention.

Next, an example of a horizontal type electronic device will be described with reference to FIGS. 6 and 7. FIG. 6 is a perspective view of an electronic device according to a second embodiment of the present invention, and FIG. 7 is a partial sectional view showing the electronic device mounted on a mother board.

The second embodiment is similar to the above-mentioned first embodiment. However, in the horizontal type electronic device of the second embodiment, the extension portion 32a of a printed board 32 is made to project outward from a side surface of a frame body 33, and leg pieces 33a are made to project downward from the four corners of the frame body 33 as shown in FIG. 6. The plurality of leader patterns 35 and through holes 36 are provided in the extension portion 32a in the same manner as these components are provided in the first embodiment.

Another difference between the second embodiment and the first embodiment is that a plurality of terminals 39 are provided directly on a mother board 37. Prior to mounting the electronic device, the terminals 39 are connected with the lands 38 on the mother board 37 by soldering, caulking, or the like. The terminals 39 are arranged so as to be inserted into the through holes 36 of the extension portion 32a and soldered with the leader patterns 35, as shown in FIG. 7. The array pitch of the terminals 39 is set to be equal to that of the through holes 36. In addition, only through holes 37a corresponding to the respective leg pieces 33a are provided in the mother board 37.

Figure 7:
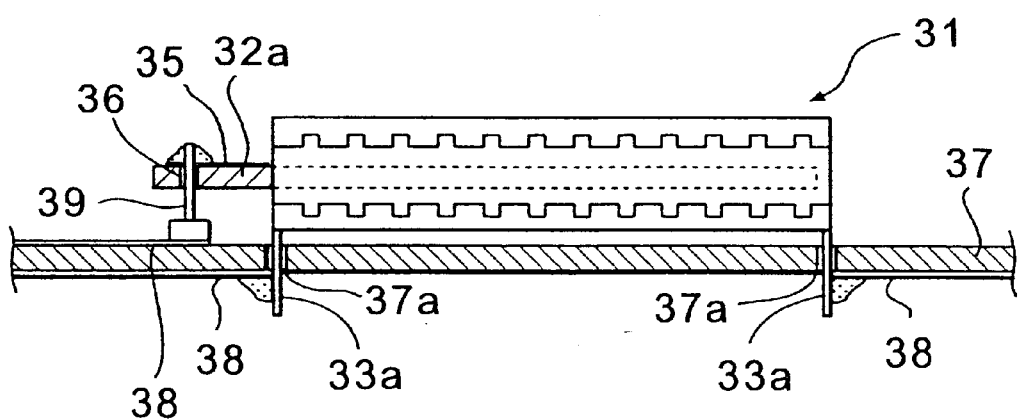
FIG. 7 is a partially sectional view showing the horizontal type electronic device of FIG. 6 mounted on a mother board.

In the second embodiment configured as described above, when the horizontal type electronic device shown in FIG. 6 is to be mounted on the mother board 37, the respective leg pieces 33a of the electronic device are inserted into the insertion holes 37a of the mother board 37, to which the plurality of terminals 39 are beforehand attached (as shown in FIG. 7). At the same time, the respective through holes 36 of the extension portion 32a are fitted to the corresponding terminals 39. Then, the respective terminals 39 and the corresponding leader patterns 35 are soldered on the surface of the extension portion 32a. The respective leg pieces 33a are likewise soldered with the lands 38 on the back surface of the mother board 37. The horizontal type electronic device can thus be mounted on the mother board 37.

In the horizontal type electronic device according to the second embodiment, the plurality of leader patterns 35, and the through holes 36 penetrating the respective leader patterns 35, are provided in the extension portion 32a of the printed board 32 projecting horizontally from the frame body 33 of the housing 31. The through holes 36 are fitted to the respective terminals 39 provided on the set-side mother board 37, and the respective leader patterns 35 and the corresponding terminals 39 are soldered to each other. Accordingly, in the same manner as the first embodiment, the respective leader patterns 35 provided in the printed board 32 function as connection terminals. Thus, the metal terminals of the conventional device are omitted, and the manufacturing cost of the electronic device is reduced. In addition, because the metal terminals have been omitted, the deformation of the metal terminals caused by transport or mounting procedures is prevented.

Figure 8:
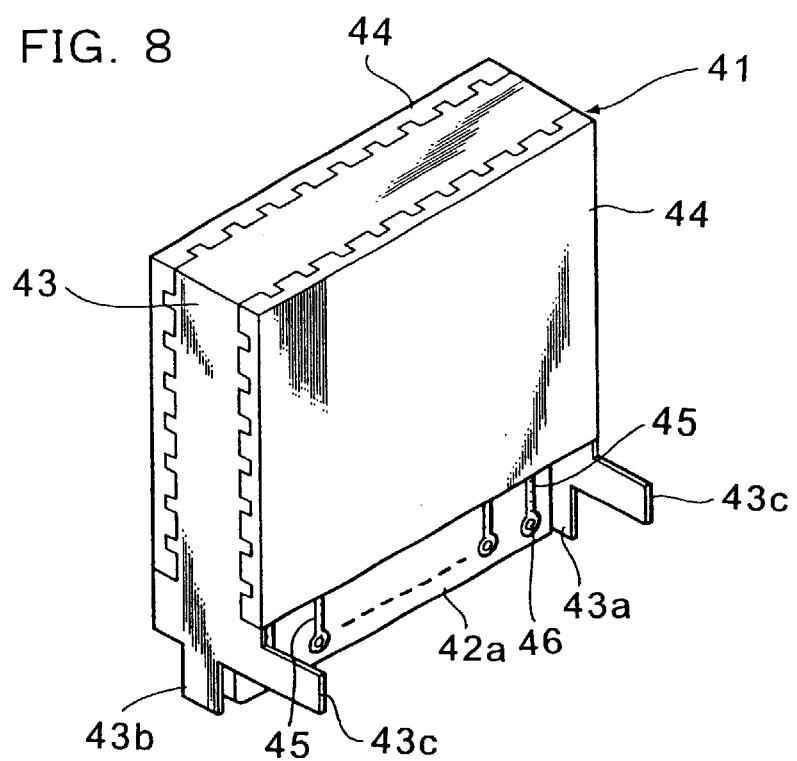
FIG. 8 is a perspective view of an electronic device according to a third embodiment of the present invention.

FIG. 8 is a perspective view of an electronic device according to a third embodiment of the present invention. This electronic device can be used as either a vertical type or a horizontal type. In this embodiment, a plurality of first leg pieces 43b are formed in a frame body 43 of the housing 41 so as to project in the same direction as an extension portion 42a. A plurality of second leg pieces 43c are also formed in the frame body 43 so as to project perpendicularly to the plate plane of the extension portion 42a (i.e., at a right-angle to the first leg pieces 43b). Accordingly, if the housing 41 is retained on a mother board 47 by use of the first leg pieces 43b, the electronic device shown in FIG. 8 can be used as a vertical type electronic device in the same manner as that in the first embodiment. On the other hand, if the housing 41 is retained on a mother board 47 by use of the second leg pieces 43c, the electronic device can be used as a horizontal type electronic device in the same manner as that in the second embodiment.

Figure 9:
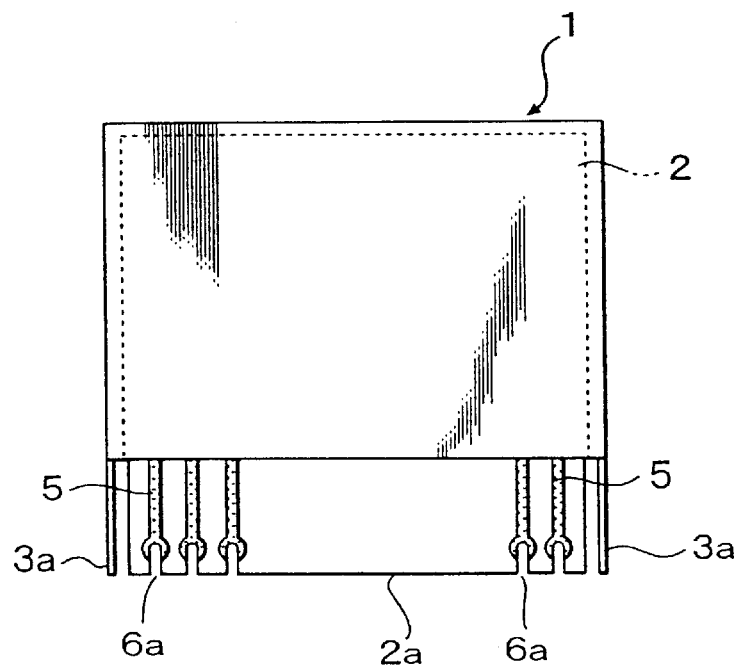
FIG. 9 is a view of a modification of the penetration portion of an electronic device according to the present invention.
Figure 10:
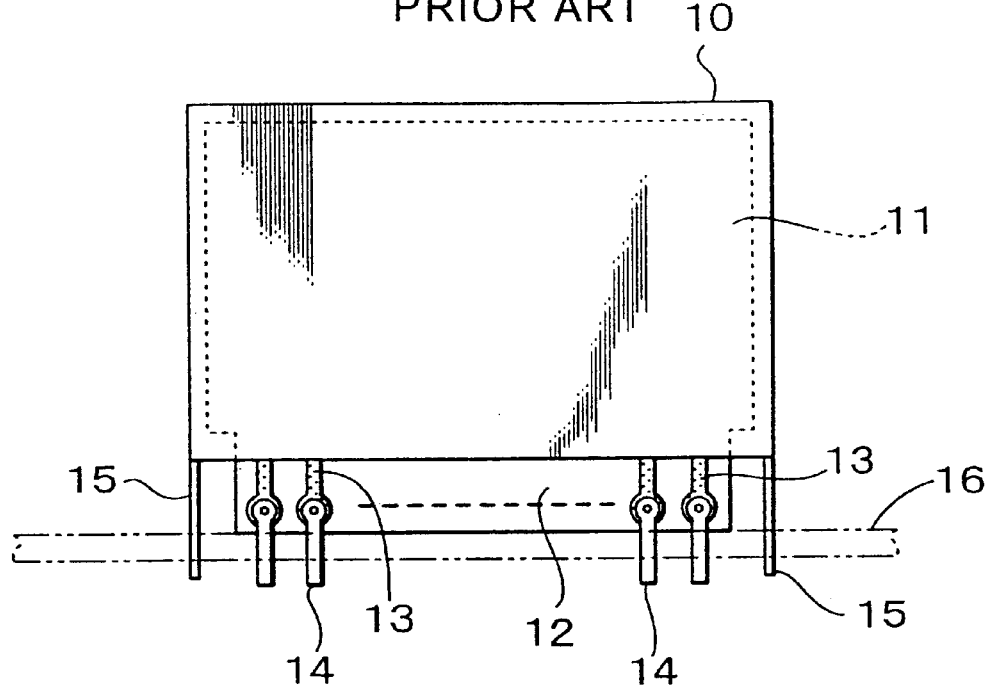
FIG. 10 is a perspective view showing a conventional vertical type electronic device.
Figure 11:
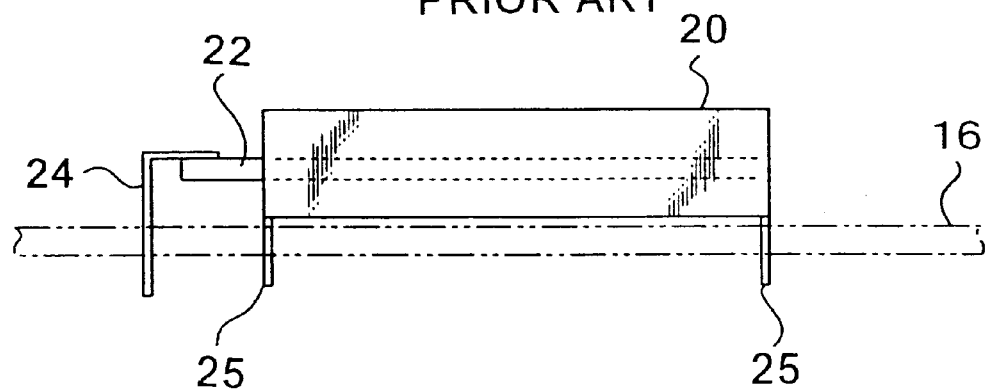
FIG. 11 is a perspective view showing a conventional horizontal type electronic device.

It should be apparent that other modifications can be made to the above-described embodiments of the present invention. For example, as shown in FIG. 9, slits 6a may be provided in the extension portion 2a so as to reach the head portions of the respective leader patterns 5. The slits 6a function as penetration portions in the same manner as the through holes 6 in the above-mentioned embodiments. In addition, the leg pieces 3a for retaining the housing 1 on the mother board 7 may be modified in shape, number, formation, or position in accordance with the variations in design or necessity. For example, in the case of a horizontal type electronic device, the leg pieces 3a may be formed in one or both of the frame body 3 and the covers 4 constituting the housing 1.

What is claimed is:

1. An electronic device comprising:

a housing which is provided with first leg pieces and second leg pieces extending outward in directions substantially perpendicular to each other; and a printed board disposed in said housing;

wherein an extension portion is provided on said printed board so as to project from said housing, the extension portion extending as far as the first leg pieces, and wherein a plurality of leader patterns are provided on the surface of said extension portion and penetration portions are provided in said extension portion so that said penetration portions penetrate said extension portion of said printed board at positions close to said leader patterns.

2. An electronic device according to claim 1, wherein said penetration portions are through holes or slits.

3. An attachment structure for an electronic device according to claim 1, wherein the electronic device is mounted to a mother board, said mother board being provided with an insertion hole into which said extension portion is inserted, leg-piece insertion holes into which said first leg pieces are inserted, and a plurality of lands located adjacent to said insertion hole and said leg-piece insertion holes, wherein said leader patterns and said lands are soldered to each other on a back surface of said mother board.

* * * * *

UNITED STATES PATENT AND TRADEMARK OFFICE
CERTIFICATE OF CORRECTION

PATENT NO.    : 6,456,505 B1                                        Page 1 of 1
DATED         : September 24, 2002
INVENTOR(S)   : Norio Suzuki et al.

It is certified that error appears in the above-identified patent and that said Letters Patent is hereby corrected as shown below:

<u>Title page,</u>
Item [56], FOREIGN PATENT DOCUMENTS, delete "10-259732" and substitute -- 10-256732 -- in its place.

Signed and Sealed this

Fourth Day of March, 2003

JAMES E. ROGAN
*Director of the United States Patent and Trademark Office*